United States Patent [19]
Kumada et al.

[11] 4,367,426
[45] Jan. 4, 1983

[54] CERAMIC TRANSPARENT PIEZOELECTRIC TRANSDUCER

[75] Inventors: Akio Kumada, Kokubunji; Takahiko Ihochi; Masashi Tanaka, both of Koganei; Kazuma Suzuki, Fuchu; Masaru Yokosuka; Shinsuke Miura, both of Hachioji; Tsutomu Ochiai, Fuchu, all of Japan

[73] Assignee: Hitachi, Ltd., Tokyo, Japan

[21] Appl. No.: 245,433

[22] Filed: Mar. 19, 1981

[30] Foreign Application Priority Data

Mar. 19, 1980 [JP] Japan .................. 55-33911

[51] Int. Cl.³ .......................... H01L 41/08
[52] U.S. Cl. .................. 310/358; 310/322; 310/334; 310/363; 252/62.9; 368/255
[58] Field of Search ............. 310/311, 357, 358, 363, 310/322, 321, 323, 334; 252/62.9; 368/159, 255, 244, 107, 73

[56] References Cited

U.S. PATENT DOCUMENTS

4,052,627 10/1977 Hawakawa ............... 310/358 X

FOREIGN PATENT DOCUMENTS

55-151286 11/1980 Japan ................... 368/255

Primary Examiner—Mark O. Budd
Attorney, Agent, or Firm—Antonelli, Terry & Wands

[57] ABSTRACT

Disclosed is a transparent piezoelectric transducer comprising, at least, a transparent vibrator and at least one plate of a piezoelectric ceramic material sandwiched between a pair of transparent electrodes, said transparent vibrator being disposed so as to be vibrated by the piezoelectric ceramic material plate, said piezoelectric ceramic material being a ceramic material which is represented by a formula:

$$Pb_{1-x}La_x(Zr_yTi_z)_{1-x/4}O_3$$

where x and y/z are set within a region enclosed with lines successively coupling points a-b-c-d-e-a in a phase diagram (FIG. 2 of the accompanying drawings) in which a ratio (y/z) between $PbZrO_3$ and $PbTiO_3$ is taken on an axis of abscissas, while an La concentration (x) is taken on an axis of ordinates (where x=8.4 and y/z=65/35 at a, x=6 and y/z=55.5/44.5 at b, x=6 and y/z=50/50 at c, x=12 and y/z=50/50 at d, and x=9 and y/z=65/35 at e). The transparent transducer is excellent in both the transparency and the electroacoustic response.

8 Claims, 7 Drawing Figures

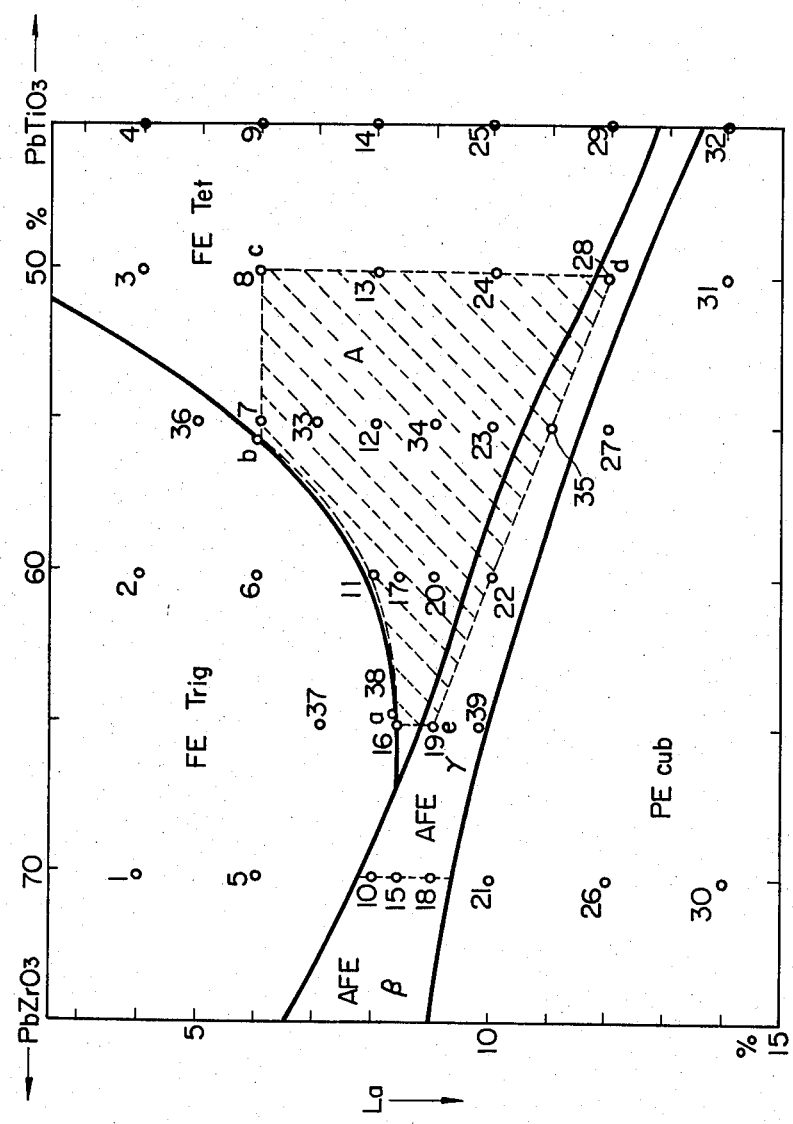

CERAMIC TRANSPARENT PIEZOELECTRIC TRANSDUCER

BACKGROUND OF THE INVENTION

1. Field of the Invention

This invention relates to a transparent piezoelectric transducer which employs a transparent piezoelectric ceramic material. This invention is very useful for microelectronic acoustic devices, and is applicable to the transducers of a watch, a radio, etc.

2. Description of the Prior Art

Recently, in microelectronic devices such as digital electronic wrist watches, the indication of a time etc. is not limited only to a visual form, but the aural indication of various functional factors including a specified time, an alarm, etc. has been required.

For example, the wrist watch is usually constructed of an optical display panel which is provided with a digital time display, a metallic case which supports the display panel and which protects a circuit portion, a transducer which is made of a piezoelectric material and which is mounted in the case, and a front glass plate which is stuck to be integral with the transducer. The transducer is excited by an electric signal from an electronic circuit, and the resulting vibration is transmitted to the glass plate to give forth, e.g., an alarm.

In such microelectronic devices, the miniaturization and the integration are required, while decorative factors are also involved, so that the utilization of transparent transducers which do not spoil the display effect when used in display portions has been attempted. Transparent piezoelectric vibrators have heretofore been seen in crystal resonators etc., but all of them are ordinarily operated in a higher frequency range. Among transducers which are operated in the audio-frequency range and used for sound production, voice production etc. requiring comparatively high power and which employ hard materials exhibiting comparatively stable frequency characteristics, there have been put into practice only ones which employ ceramic materials of the type of a lead lanthanum zirconate titanate solid solution (in general, called "PLZT").

An example of such transparent piezoelectric transducers is disclosed in Japanese Unexamined Published Patent Application No. 1978-55171.

Regarding the transducers, however, notwithstanding that the PLZT has been expected to exhibit a ferroelectricity and to have a great piezoelectric effect, any concrete product which positively applies the piezoelectric property thereof has not appeared yet.

SUMMARY OF THE INVENTION

An object of this invention is to realize a transparent piezoelectric transducer of good electroacoustic response. The transparent piezoelectric transducer is used for a watch, a desk calculator, a radio set, a television set, etc. Since it is transparent, it can serve also as the window of a display portion and can simultaneously omit a space for a sound producing element. The window is required to exhibit the highest possible light transmittance and to have the least possible clouding based on the scattering of light.

The object of this invention is achieved with the PLZT of a narrowly limited composition.

This invention consists in employing as a piezoelectric material a ferroelectric tetragonal or antiferroelectric pseudocubic ceramic material represented by:

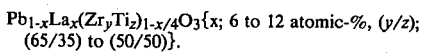

$Pb_{1-x}La_x(Zr_yTi_z)_{1-x/4}O_3\{x;$ 6 to 12 atomic-%, $(y/z);$ (65/35) to (50/50)$\}$.

More concretely, the invention consists in employing a ceramic material represented by a formula of:

$Pb_{1-x}La_x(Zr_yTi_z)_{1-x/4}O_3$ where x and the ratio y/z can be set in a region which is enclosed with lines successively coupling points a-b-c-d-e-a in a phase diagram shown in FIG. 2 of the accompanying drawings (where $x=8.4$ and $y/z=65/35$ at a, $x=6$ and $y/z=55.5/44.5$ at b, $x=6$ and $y/z=50/50$ at c, $x=12$ and $y/z=50/50$ at d, and $x=9$ and $y/z=65/35$ at e.)

As compositions, PLZT ceramic materials are usually broadly classified into the four phases of a ferroelectric trigonal phase (FE Trig), a ferroelectric tetragonal phase (FE Tet), a paraelectric cubic phase (PE cub) and an antiferroelectric pseudocubic phase (AFE). The inventors conducted close experiments and measurements on various points of the above compositions. As a result, it has been found out that only parts of the AFE and FE Tet phases have composition regions which are good in both the transparency and the piezoelectric property and which are suited to transparent piezoelectric transducers. More specifically, the AFE phase is divided into a narrow region extending along the FE phase and dislocated to the FE phase upon application of a voltage, and the other region, and a part of the former includes a region which is good in both the transparency and the piezoelectric property and which is suited to a transparent transducer. Also within the region of the FE Tet phase, a region which is good in both the transparency and the piezoelectric property and which is suited to a transparent transducer exists after a polarization treatment.

BRIEF DESCRIPTION OF THE DRAWINGS

FIG. 2 is a phase diagram of a PLZT solid solution.

DETAILED DESCRIPTION OF THE PREFERRED EMBODIMENTS

Hereunder, this invention will be described in detail in connection with embodiments.

Figure 1:
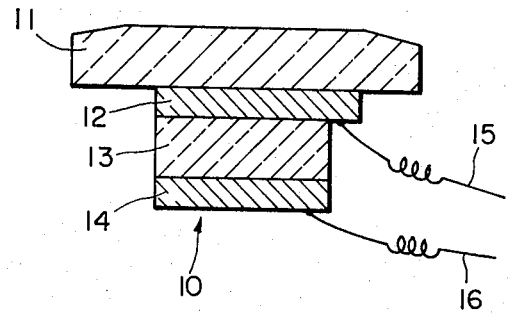
FIG. 1 is a schematic sectional view of a transparent piezoelectric transducer which adopts this invention.

FIG. 1 is a schematic sectional view of a transparent piezoelectric transducer which employs a piezoelectric material in this invention.

A transparent transducer 10 is constructed by sticking to a transparent plate 11 a piezoelectric ceramic plate 13 which is a transparent ceramic plate of a lead lanthanum zirconate titanate solid solution (PLZT) of a predetermined composition as sandwiched between transparent electrodes 12 and 14 made of tin oxide ($SnO_2$), indium oxide ($In_2O_3$) or the like. This is a transducer of the so-called bimorph type. When a predetermined electric signal is applied across the electrodes through leads 15 and 16, the transparent bimorph transducer 10 vibrates in a bending mode, and a sound is radiated to the surroundings.

Data obtained by variously changing the respective composition elements of the PLZT material and studying the usability as the transducer are listed in Table 1.

TABLE 1

Composition of PLZT and Usability as Transducer

| No. | Zr | Ti | La | Usability as Transparent piezoelectric transducer | Trans parency* | Piezoelectricity | Ferroelectricity |
|---|---|---|---|---|---|---|---|
| 1 | 70 | 30 | 4 | x | x | ○ | ○ |
| 2 | 60 | 40 | 4 | x | x | ○ | ○ |
| 3 | 50 | 50 | 4 | x | x | ○ | ○ |
| 4 | 45 | 55 | 4 | x | x | ○ | ○ |
| 5 | 70 | 30 | 6 | x | x (cloud) | ○ | ○ |
| 6 | 60 | 40 | 6 | x | x (cloud) | ○ | ○ |
| 7 | 55 | 45 | 6 | △ | △ | ○ | ○ |
| 8 | 50 | 50 | 6 | △ | △ | ○ | ○ |
| 9 | 45 | 55 | 6 | x | ○ | x | ○ |
| 10 | 70 | 30 | 8 | x | x (cloud) | ○ | ○ |
| 11 | 60 | 40 | 8 | △ | ○ | ○ | ○ |
| 12 | 55 | 45 | 8 | ⊚ | ○ | ○ | ○ |
| 13 | 50 | 50 | 8 | ○ | ○ | ○ | ○ |
| 14 | 45 | 55 | 8 | x | ○ | x | ○ |
| 15 | 70 | 30 | 8.4 | x | x (cloud) | x | x |
| 16 | 65 | 35 | 8.4 | △ | △ | △ | ○ |
| 17 | 60 | 40 | 8.4 | ⊚ | ○ | ○ | ○ |
| 18 | 70 | 30 | 9 | x | x (cloud) | x | x |
| 19 | 65 | 35 | 9 | △ | ○ | △ | △ |
| 20 | 60 | 40 | 9 | ⊚ | ○ | ○ | ○ |
| 21 | 70 | 30 | 10 | x | ○ | x | x |
| 22 | 60 | 40 | 10 | △ | ○ | △ | ○ |
| 23 | 55 | 45 | 10 | ⊚ | ○ | ○ | ○ |
| 24 | 50 | 50 | 10 | ○ | ○ | ○ | ○ |
| 25 | 45 | 55 | 10 | x | ○ | x | ○ |
| 26 | 70 | 30 | 12 | x | ○ | △ | x |
| 27 | 55 | 45 | 12 | x | ○ | x | x |
| 28 | 50 | 50 | 12 | ○ | ○ | △ | ○ |
| 29 | 45 | 55 | 12 | x | ○ | x | ○ |
| 30 | 70 | 30 | 14 | x | ○ | x | x |
| 31 | 50 | 50 | 14 | x | ○ | x | x |
| 32 | 45 | 55 | 14 | x | ○ | x | x |

*Transparency after polarization 32 samples to-be-measured of the PLZT whose compositions were different from one another were prepared. The composition ratios of lead zirconate ($PbZrO_3$), lead titanate ($PbTiO_3$) and lanthanum oxide ($La_2O_3$) of the samples were made different from one another, and the characteristics of the transparency, piezoelectricity and ferroelectricity thereof and the suitability to the vibrator of the transparent transducer were assessed with reference to numerical values to be stated later.

Mark ⊚ in the table indicates a sample especially good for use, mark o a usable sample, and a mark △ a sample usable though it has some difficulty in practicability. Mark x indicates a sample unusable.

FIG. 2 is a phase diagram of the PLZT solid solution.

In the phase diagram, the experimental points of Table 1 are plotted. A region A hatched in the figure indicates a material composition which can be applied to the transparent piezoelectric transducer of this invention. It is understood from the result that the region enclosed with the following curves and straight lines corresponds to the material according to this invention. (1) The region lies on the FE Tet phase side with respect to a curve a-b which indicates the boundary between the ferroelectric trigonal phase (indicated as FE Trig in the figure) and the ferroelectric tetragonal phase (indicated as FE Tet in the figure). The composition on the left side with respect to the curve a-b has its crystalline structure turned into the trigonal phase when polarized, with the result that the light scattering increases to sharply attenuate the transparency. (2) The region lies on the FE Tet side which is bordered by a straight line b-c and which has an La concentration of at least 6 atomic-%. When the La concentration lowers, the transparency worsens and the light transmittance for short wavelengths is spoilt. In order to allow the composition to be put into practical use as cloudless transparent ceramics, the light transmittance for at least a wavelength of 400 nm needs to be about 20% or more. For this reason, the La concentration needs must be at least 6 atomic-%. (3) The region lies on the FE Tet side which is bordered by a straight line c-d and in which Zr/Ti is at least 50/50. When the Zr/Ti ratio decreases, the piezoelectricity lowers. In order to allow the composition to be put into practical use as the piezoelectric transducer, it is at least necessary to attain the conditions of $d_{31}$ (piezoelectric modulus) $\geq 100$ (picocoul/N) and and $k_{31}$ (electromechanical coupling factor) $\geq 25\%$. From this viewpoint, the desired region ought to lie on the left side of the straight line c-d. (4) The ferroelectricity disappears on the side lower than a straight line e-d, that is, on the side on which La is more, so that the composition cannot be used as the piezoelectric ceramics. Accordingly, the desired region must not underlie the straight line e-d. A region where the straight line e-d exists is in the antiferroelectric pseudocubic phase (indicated as AFE in the figure). When polarized by applying a high electric field of several hundred V, the AFE phase is dislocated to the FE Tet phase, but no scattering occurs and the transmittance decreases little. (5) The region lies on the FE Tet side and in the AFE phase which are bordered by a straight line a-e and in which Zr/Ti is at most 65/35.

Thus, the material of the piezoelectric ceramic is the PLZT which has at least a light transmittance of 12–65% and a piezoelectric modulus of 100–310 pcoul/N and which at least forms a tetragonal crystal upon application of a voltage.

Such PLZT for use in the transparent transducer of this invention is formed as follows: (1) Each of powders of lead oxide (PbO), lanthanum oxide ($La_2O_3$), zirconium oxide and titanium oxide ($TiO_2$) is weighed every mole at a precision of 0.17 gram in conformity with a desired molecular formula (or composition). (2) The weighed materials are put in a polyethylene jar, have a ball of high-purity alumina ($Al_2O_3$) and a small amount of distilled water added thereto and are subjected to ball-milling for one hour. (3) A liquid after the ball-milling is put into a container of stainless steel, a supernatant liquid is removed, and a slip is held at 150° C. for one hour to be dried, (4) after cooling it to the room temperature, it is pulverized with a resin pestle, and (5) it is put into an alumina crucible and is held at 900° C. for one hour to be calcined. (6) The calcined powdery mixture is shifted into the polyethylene jar again, and is ball-milled for about 16 hours with the $Al_2O_3$ ball and a small amount of acetone. Subsequently, (7) the ball-milled mixture is preliminarily dried while stirring it in a stainless steel container provided with a hood, and (8) it is dried by holding it at 180° C. for one hour. Next, (9) the dried mixture is put in an alumina crucible and held at 700° C. for one hour, thereby to eliminate organic matters. (10) The resultant powder is molded under a pressure of about 350 kg/cm², and the molded compact is put in $Al_2O_3$ dies with magnesia particles of −50 to +100 meshes laid to a thickness of about 3 mm and is deaerated by bringing the interior of the dies into a vacuum, and (11) the molded compact is heated to 900° C., whereupon it is heated to 1,200° C. under application of a pressure of about 150 kg/cm² and while circulating oxygen at a rate of 0.135 m³/hr. After the temperature of 1,200° C. has been reached, the resultant compact is subjected to hot pressing by holding it for 8 hours under application of a pressure of 350 kg/cm². A rough stone after the hot pressing is slowly cooled down to the room temperature, and is taken out of a mold with a core drill, (12) it is sliced into flat sheets 0.25 mm thick at pitches of 0.5 mm, (13) each sheet is lapped with carborundum grains of #2000, and via a preliminary polishing, it is polished with #4000 or still finer powdery grains, to be finished up into a transparent flat plate 0.2 mm thick. (14) The polished sample is annealed by holding it at 600° C. for 30 minutes, thereby to eliminate working distortions. At the next step, (15) $In_2O_3$—$SnO_2$ films are deposited on both the major surfaces of the transparent flat plate by the vacuum sputtering, to form transparent electrodes. (16) By applying a D.C. voltage of 500–1,000 V across the transparent electrodes for 10 minutes or longer, a polarization treatment is carried out to afford a piezoelectricity. A DC voltage of at most 1 V is applied per across the thickness of 1 μm of piezoelectric material. The upper bound is breakdown limits for a material.

Figure 3:
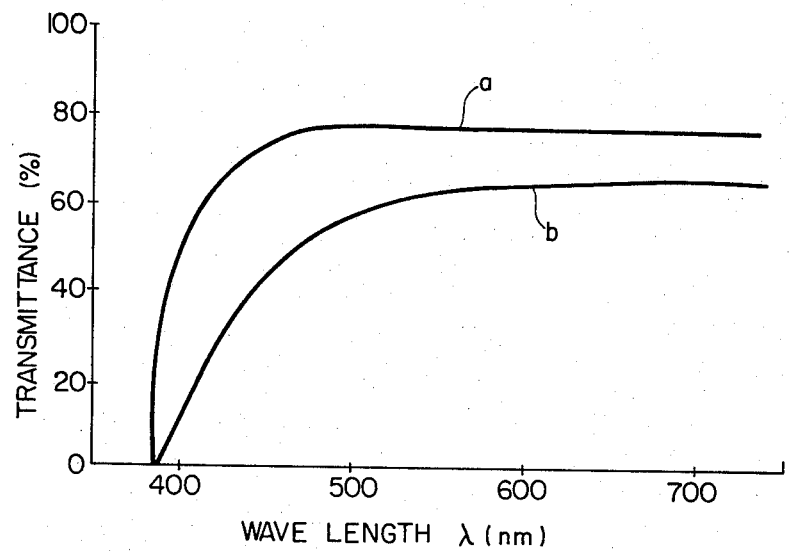
FIG. 3 is a graph of the transmittance characteristic of the transparent piezoelectric transducer of this invention.

The raw material of the transparent piezoelectric transducer is obtained by the manufacturing process as thus far described. At this time, the transparent electrodes act also as antireflection coatings, and hence, the light transmittance for the center wavelength $\lambda = 550$ nm of the visible radiation is permitted to reach 90% or greater. More specifically, although the loss component based on reflection is great and a high transmittance is not exhibited with the transparent ceramic material only, the loss component is eliminated by the antireflection coatings and a transmittance of or above 70% is attained. These circumstances are shown in FIG. 3. In the figure, b indicates the wavelength characteristics of the transmittance of the transparent piezoelectric transducer in the absence of the antireflection coatings, and a the wavelength characteristics thereof in the presence of the antireflection coatings. Since the light transmittance at 400 nm is already greater than 50%, the transparency for blue is particularly good.

Figure 4:
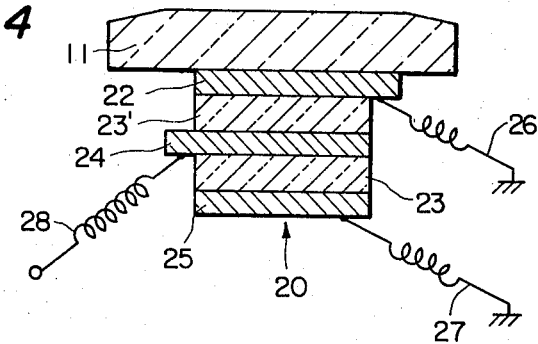
FIG. 4 is a schematic sectional view showing an example of the transparent piezoelectric transducer of this invention.

FIG. 4 is a schematic sectional view of another transparent transducer which adopts this invention. Transparent electrode plates 22, 24 and 25 which are disposed to be respectively connected with voltage applying leads 26, 28 and 27 hold therebetween PLZT ceramic plates 23 and 23' made of the composition of this invention, to construct a transparent piezoelectric transducer 20 of the bimorph type.

When voltages are applied to the electrode plates 22, 24 and 25, the PLZT ceramic plates give rise to bending deformations respectively. The foregoing transducer of FIG. 1 is called the unimorph or monomorph type in a broad sense, whereas the transducer of FIG. 4 is the bimorph structure in a narrow sense and can provide a sound output far greater than an input voltage.

In examples of this embodiment, tin oxide or indium oxide previously referred to was used for the transparent electrode. 31 (thirty-one) samples to be described later were used for the PLZT ceramic plate. In accordance with the general description, the composition of each sample is expressed by La/Zr/Ti. Zr and Ti are described to become 100% in total. The samples used here are 8.4/65/35, 8/60/40, 9/60/40, 10/60/40, 7/55/45, 8/55/45, 9/55/45, 10/55/45, 11/55/45, 6/50/50, 8/50/50, 10/50/50, 12/50/50, 4/45/55, 6/45/55, 8/45/55, 10/45/55, 12/45/55, 14/45/55, 4/50/50, 14/50/50, 5/55/45, 6/55/45, 12/55/45, 7/60/40, 9/65/35, 7/65/35, 8.3/65/35, 9.5/65/35, 8/70/30, and 9/70/30. Elements were formed by polishing these crystals to be 0.2 mm thick. Measured results of these elements are listed in Table 2.

TABLE 2

Various Factors of Transparent Piezoelectric Ceramic Materials

| No. | La/Zr/Ti | Transmittance Before polarization (%) 400nm/600nm | | Transmittance After polarization (%) 400nm/600nm | | Electromechanical coupling factor $k_{31}$ (%) | Piezoelectric modulus $d_{31}$ (pcoul/N) | Relative dielectric constant ε | Curie temperature $T_c$ (°C.) | Sample No. in FIG. 2 | Remarks |
|---|---|---|---|---|---|---|---|---|---|---|---|
| 1 | 84/65/35 | 32 | 65 | 14 | 63 | 30 | 310 | 4800 | 25 | 16 | |
| 2 | 8/60/40 | 25 | 61 | 24 | 55 | 32 | 233 | 3850 | 122 | 11 | |
| 3 | 9/60/40 | 28 | 63 | 28 | 60 | 30 | 265 | 4500 | 90 | 20 | |
| 4 | 10/60/40 | 32 | 65 | 32 | 65 | — | — | 6050 | <RT | 22 | |
| 5 | 7/55/45 | 22 | 45 | 20 | 54 | 30 | 140 | 2080 | 190 | 33 | |
| 6 | 8/55/45 | 24 | 58 | 22 | 58 | 28.5 | 144 | 2300 | 160 | 12 | |
| 7 | 9/55/45 | 29 | 60 | 26 | 60 | 27.5 | 152 | 2600 | 123 | 34 | |
| 8 | 10/55/45 | 32.5 | 62 | 29 | 61 | 26 | 161 | 3270 | 92 | 23 | |
| 9 | 11/55/45 | 32 | 65 | 32 | 65 | — | — | 5600 | <RT | 35 | |
| 10 | 6/50/50 | 12 | 50 | 14 | 53 | 28 | 100 | 1384 | 230 | 8 | |
| 11 | 8/50/50 | 18 | 56 | 20 | 58.5 | 26 | 110 | 1580 | 162 | 13 | |
| 12 | 10/50/50 | 25 | 61 | 26 | 62 | 25 | 120 | 3010 | 95 | 24 | |
| 13 | 12/50/50 | 32 | 65 | 32 | 65 | — | — | 5432 | <RT | 28 | |
| 14 | 6/55/45 | 21 | 50 | 20 | 50 | 32 | 135 | 1910 | 215 | 7 | |
| 15 | 9/65/35 | 32 | 65 | 32 | 65 | 30 | 310 | 6080 | 26 | 19 | |
| 16 | 4/50/50 | 10 | 48 | 12 | 50 | 30 | 90 | 1210 | 300 | 3 | low |
| 17 | 4/45/55 | 8 | 45 | 10 | 47 | 27 | 82 | 950 | 315 | 4 | piezoelectricity |
| 18 | 6/45/55 | 10 | 48 | 12 | 50 | 25 | 87 | 1050 | 240 | 9 | |
| 19 | 8/45/55 | 12 | 50 | 14 | 52 | 24 | 95 | 1330 | 167 | 14 | small electro- |
| 20 | 10/45/55 | 20 | 52 | 22 | 53 | 23 | 107 | 2810 | 100 | 25 | mechanical |

TABLE 2-continued

| | | Transmittance | | | | | | | | |
|---|---|---|---|---|---|---|---|---|---|---|
| | | Before polarization (%) | | After polarization (%) | | Electromechanical coupling factor | Piezoelectric modulus | Relative dielectric constant | Curie temperature | Sample No. in |
| No. | La/Zr/Ti | 400nm | 600nm | 400nm | 600nm | $k_{31}$ (%) | $d_{31}$ (pcoul/N) | $\epsilon$ | $T_c$ (°C) | FIG. 2 | Remarks |
| 21 | 12/45/55 | 28 | 62 | 29 | 63 | 22 | 125 | 4850 | 85 | 29 | coupling factor |
| 22 | 14/45/55 | 32 | 65 | 32 | 65 | — | — | 7580 | <RT | 32 | no piezoelectricity |
| 23 | 7/60/40 | 23 | 58 | 12 | 45 | 32 | 170 | 3220 | 155 | 6 | clouding |
| 24 | 8.3/65/35 | 31 | 63 | 31 | 63 | — | — | 6270 | <RT | 38 | no piezoelectricity |
| 25 | 9.5/65/35 | 32 | 65 | 32 | 65 | — | — | 7500 | <RT | 39 | |
| 26 | 7/65/35 | 32 | 65 | 12 | 61 | 28 | 300 | 4000 | <RT | 37 | clouding |
| 27 | 12/55/45 | 31 | 63 | 31 | 63 | — | — | 7790 | <RT | 27 | no piezoelectricity |
| 28 | 14/50/50 | 31 | 63 | 31 | 63 | — | — | 7650 | <RT | 31 | |
| 29 | 8/70/30 | 31 | 63 | 31 | 63 | — | — | 6300 | <RT | 10 | |
| 30 | 9/70/30 | 32 | 63 | 32 | 63 | — | — | 6450 | <RT | 18 | clouding |
| 31 | 5/55/45 | 24 | 50 | 12 | 41 | 30 | 150 | 2400 | 180 | 36 | |

Table 2 indicates on the respective samples the transmittances for wavelengths of 400 nm and 600 nm before and after polarization (application of a D.C. voltage of 500 V), the electromechanical coupling factors $k_{31}$, the piezoelectric moduli $d_{31}$, the relative dielectric constants $\epsilon$ and the Curie temperatures $T_c$.

Samples Nos. 1–15 are samples which can be applied to the transparent piezoelectric transducer of this invention. On the other hand, samples Nos. 16–31 are comparative examples.

Figure 5:
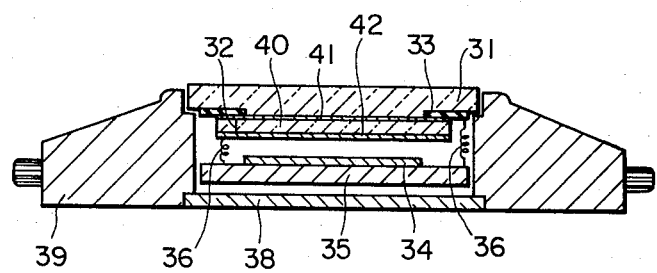
FIG. 5 is a schematic sectional view of a watch which adopts the transparent piezoelectric transducer.

FIG. 5 shows a schematic sectional view of a wrist watch which employs the transparent piezoelectric transducer of this invention. The figure illustrates a case where a transparent piezoelectric transducer plate 32 is worked into a disc and is stuck inside a transparent cover 31 such as the glass cover of the wrist watch, to form a transparent buzzer. The transparent piezoelectric transducer 32 is so constructed that transparent electrodes 41 and 42 of tin oxide or the like are attached onto both the surfaces of a piezoelectric crystal 40. Numeral 39 designates a watch case, and numeral 33 a packing ring for fixing the glass plate 31. A watch display portion 34, a driving module 35, etc. are contained in the case. Leads 36 serve to electrically couple the transparent electrodes of the transducer with conductive terminals. Shown at 38 is a back cover. In an example, the transducer could be operated as a wrist watch alarm buzzer of pleasant tone and great sound volume by applying a wrist watch alarm signal which consisted of pulse modulation waves having a frequency of 2 kHz or 4 kHz and an amplitude of 10 $V_{pp}$. Examples of the transducer which used as the piezoelectric materials the PLZT materials having the composition ratios of 6–12% of La, 50–65% of Zr and 35–50% of Ti were very good in points of the transparency and the production of pleasant tone.

The transparent piezoelectric transducer of this invention can also be used as a flat panel speaker. In this case, the periphery of a transparent vibrator is put into the shape of a smooth curve or into the shape in which straight lines are connected by smooth curves having at least two centers of curvature. As the peripheral shapes, an ellipse, a curve represented by $(X^n/a)+(Y^n/b)=1$ (n: positive number), a plane figure obtained by rounding the apical angles of a polygon circumscribed or inscribed to an ellipse, etc. are especially favorable for the speaker.

In the case of the elliptical peripheral shape, it is particularly favorable that the major axis is $\sqrt{1.5}-\sqrt{2.5}$ times longer than the minor axis. In the case of the shape represented by the expression of $(X^n/a)+(Y^n/b)=1$, the following is remarked:

(1) At n=1, the curve is unsuited to the speaker irrespective of the axial ratio of b/a.

(2) At n=2, a range in which the axial ratio (major axis/minor axis) is $\sqrt{1.5}-\sqrt{2.5}$ is favorable. This corresponds to the foregoing case of an ellipse.

(3) At n=3, a range in which the axial ration is $\sqrt{1.25}-\sqrt{2.5}$ is favorable.

(4) At $4 \leq n \leq 20$, a range in which the axial ratio is $1-\sqrt{2.5}$ is favorable.

Regarding the values of n from 2 to 4, the preferable lower limit of the axial ratio is roughly a magnitude obtained by interpolating the corresponding value.

Figure 6:
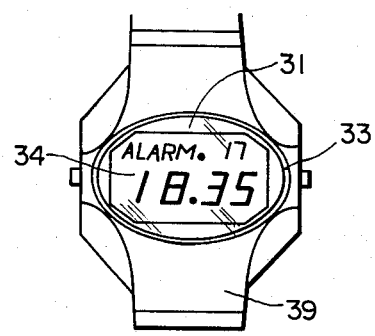
FIG. 6 is a typical plan view of a watch.

FIG. 6 is a schematic plan view of a watch which contains a speaker therein. Numeral 34 designates a display portion of the watch, and numeral 31 a vibrator as which a glass plate is usually used. Shown at numeral 39 is a metal case for the watch. A sectional view of the watch is similar to FIG. 5. The vibrator 31 made of glass is put into the shape favorable for the speaker as stated before. By way of example, the shape of the cover glass 31 is made an ellipse whose major axis and minor axis are at a ratio of $\sqrt{2}:1$. A ceramics member 40 which is made of PLZT and which has transparent electrodes 41 and 42 disposed on both its surfaces is stuck inside the cover glass 31, whereupon it is fitted in the metal case 39 by the use of a packing 33. Thus, the flat panel speaker is constructed.

The display region 34 located at the central part of the interior of the body of the watch serves to indicate a time and is constructed of liquid crystal means or light emitting diodes. The transparent piezoelectric transducer of this invention is disposed in a manner to cover the region. Herein, the transducer is somewhat larger than the display region, and the transparent electrodes of the transducer are electrically coupled with conductive terminals and leads 36. In an example, the watch display portion 34, a driving module 35 and a speech synthesizing IC chip for producing a time signal sound were contained in the case, and a time signal switch was started. Then, the voices of times such as "It is 9:30 now." programed with the times could be clearly produced. A sound producer is a transparent speaker of the "monomorph" structure. A signal of the IC module 35 is amplified to a sound wave signal of 8 $V_{pp}$, which is applied to the piezoelectric transducer 32. The piezoelectric vibration of the transducer corresponding to the sound wave signal is turned into a bending mode owing to the fact that the transducer is stuck to the glass plate or vibrator. As a result, a sound wave is radiated outwards from the surface of the glass. A sound producing band is set at 1-3 kHz in which the resonances of a large number of bending modes of the monomorph transducer stuck to the glass plate lie in a row. Therefore, the voice of the human being can be produced very clearly in spite of the low voltage signal.

Figure 7:
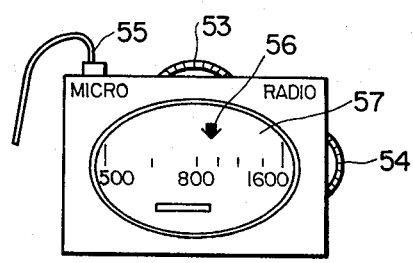
FIG. 7 is a typical plan view of a miniature radio.

FIG. 7 shows a typical view of an example in which the transparent piezoelectric transducer of this invention is applied to the speaker of a micro-radio. An IC with necessary electronic circuits packaged, a wire 55 for an antenna, a variable capacitor 53, and a volume control 54 with a switch are assembled in a case as in a conventional small-sized radio. Shown at 57 is the speaker which is the transparent piezoelectric transducer of this invention. Since the speaker is transparent, the display of indicators inside a case is not hampered. An example of the indicators is an arrow 56 indicative of a frequency as is moved by the variable capacitor 53. In this manner, it is unnecessary to dispose the indicators and the speaker in separate places, which is very advantageous for miniaturization. The sectional structure of the transparent piezoelectric transducer is the same as in FIG. 1. Of course, the structure of FIG. 4 may well be employed.

As thus far described, the transparent piezoelectric transducer of this invention is applicable as a transparent buzzer or a transparent speaker to microelectronic devices such as various alarms, wrist watches, desk calculators, sound synthesizers, transceivers, electronic game machines, cameras and micro-radios.

Although only the transducers of the bimorph type and the monomorph type have been referred to in the foregoing embodiments of this invention, the present invention is also applicable to transducers of the length expander transverse mode type, the length expander longitudinal mode type, the thickness extensional mode type, the thickness shear mode type, the planar expander mode type, the piezoelectric transformer type, etc.

What is claimed is:

1. A transparent piezoelectric transducer comprising, at least, a transparent vibrator and at least one plate of a piezoelectric ceramic sandwiched between a pair of transparent electrodes, said transparent vibrator being disposed so as to be vibrated by the piezoelectric ceramic plate, said piezoelectric ceramic being a ceramic material which is represented by a formula:

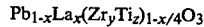
$$Pb_{1-x}La_x(Zr_yTi_z)_{1-x/4}O_3$$

where x and y/z are set within a region which is enclosed with lines successively coupling points a-b-c-d-e-a in a phase diagram shown in FIG. 2 of the accompanying drawings (where x=8.4 and y/z=65/35 at a, x=6 and y/z=55.5/44.5 at b, x=6 and y/z=50/50 at c, x=12 and y/z=50/50 at d, and x=9 and y/z=65/35 at e.).

2. A transparent piezoelectric transducer according to claim 1, wherein one pair of transparent electrodes are disposed on both surfaces of said piezoelectric ceramic material plate, and at least one of said transparent electrodes lies in contact with said vibrator.

3. A transparent piezoelectric transducer according to claim 1, wherein two piezoelectric ceramic material plates are disposed in a manner to sandwich a first transparent electrode therebetween, second transparent electrodes are respectively disposed on surfaces of said piezoelectric ceramic material plates opposite to said first transparent electrode, and one of said second transparent electrodes lies in contact with said vibrator.

4. A transparent piezoelectric transducer according to claims 1 to 3, wherein a plane figure indicative of a periphery of said vibrator is a shape of a smooth curve or a shape in which straight lines are connected by smooth curves having at least two centers of curvature.

5. A transparent piezoelectric transducer according to claim 4, wherein said plane figure indicative of the periphery of said vibrator is at least one member selected from the group consisting of an ellipse, a polygon whose corners have been rounded, and a shape which, when normalized, is represented by an equation of $X^n+Y^n=1$ (where n: positive number) or by an equation of $(X^n/a)+(Y^n/b)=1$ (where n: positive number).

6. A transparent piezoelectric transducer according to claim 4, wherein said plane figure indicative of the periphery of said vibrator is a shape in which desired parts of a plurality of shapes are smoothly coupled, said plurality of shapes being selected from the group consisting of an ellipse, a polygon with its corners rounded, and a shape that, when normalized, is represented by an equation of $X^n+Y^n=1$ (where n: positive number) or by an equation of $(X^n/a)+(Y^n/b)=1$ (where n: positive number).

7. A watch having a transparent piezoelectric transducer; said transparent piezoelectric transducer including, at least, a transparent vibrator and at least one plate of a piezoelectric ceramic material which is sandwiched between a pair of transparent electrodes, said vibrator being disposed so as to be vibrated by the piezoelectric ceramic material plate, said piezoelectric ceramic material being a ceramic material which is represented by a formula:

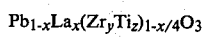
$$Pb_{1-x}La_x(Zr_yTi_z)_{1-x/4}O_3$$

where x and y/z are set within a region which is enclosed with lines successively coupling points a-b-c-d-e-a in a phase diagram shown in FIG. 2 of the accompanying drawings (where x=8.4 and y/z=65/35 at a, x=6 and y/z=55.5/44.5 at b, x=6 and y/z=50/50 at c, x=12 and y/z=50/50 at d, and x=9 and y/z=65/35 at e.).

8. A radio set comprising a transparent piezoelectric transducer as a speaker thereof; said transparent piezoelectric transducer including, at least, a transparent vibrator and at least one plate of a piezoelectric ceramic material sandwiched between a pair of transparent electrodes; said transparent vibrator being disposed so as to be vibrated by the piezoelectric crystal plate; said piezoelectric ceramic material being a ceramic material which is represented by a formula:

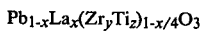
$$Pb_{1-x}La_x(Zr_yTi_z)_{1-x/4}O_3$$

where x and y/z are set within a region which is enclosed with lines successively coupling points a-b-c-d-e-a in a phase diagram shown in FIG. 2 of the accompanying drawings (where x=8.4 and y/z=65/35 at a, x=6 and y/z=55.5/44.5 at b, x=6 and y/z=50/50 at c, x=12 and y/z=50/50 at d, and x=9 and y/z=65/35 at e.).

* * * * *